US011870249B2

(12) United States Patent
Wilhide et al.

(10) Patent No.: US 11,870,249 B2
(45) Date of Patent: Jan. 9, 2024

(54) ELECTRICAL POWER SYSTEM INCLUDING ENERGY STORAGE MODULES AND SHARED SYSTEM CONTROLLER

(71) Applicant: Hamilton Sundstrand Corporation, Charlotte, NC (US)

(72) Inventors: Matthew L Wilhide, Cherry Valley, IL (US); William S. Heglund, Rockford, IL (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 1002 days.

(21) Appl. No.: 15/988,238

(22) Filed: May 24, 2018

(65) Prior Publication Data

US 2019/0359064 A1  Nov. 28, 2019

(51) Int. Cl.
*B60L 53/20* (2019.01)
*H02J 1/10* (2006.01)
*B60L 50/15* (2019.01)
*H02M 3/06* (2006.01)
*H03K 3/45* (2006.01)

(52) U.S. Cl.
CPC .............. *H02J 1/102* (2013.01); *B60L 50/15* (2019.02); *B60L 53/20* (2019.02); *H02M 3/06* (2013.01); *H03K 3/45* (2013.01); *H02J 2310/46* (2020.01)

(58) Field of Classification Search
CPC ..... Y02E 60/12; H01M 2/1055; H01M 10/46; H01M 10/425; H02J 7/0045; H02J 15/00; B60L 50/15; B60L 53/20; H02M 3/06; H03K 3/45; Y10T 307/707

USPC ......................................................... 320/112
See application file for complete search history.

(56) References Cited

U.S. PATENT DOCUMENTS

| 7,100,717 | B2 | 9/2006 | Stancu et al. | |
|---|---|---|---|---|
| 9,774,263 | B1* | 9/2017 | Chen | H02M 1/08 |
| 9,837,996 | B2 | 12/2017 | Kuznetsov | |
| 2005/0052169 | A1* | 3/2005 | Thrap | H02J 7/345 |
| | | | | 323/282 |
| 2008/0097664 | A1* | 4/2008 | Aoyama | H02J 7/1423 |
| | | | | 701/36 |

(Continued)

OTHER PUBLICATIONS

Elsied, M. et. al. "Real-time Implementation of Four-phase Interleaved DC-DC Boost Converter for Electric Vehicle Power System," Electric Power Systems Research, Elsevier, Amsterdam, NL, vol. 141, Aug. 17, 2016. pp 210-220.

(Continued)

*Primary Examiner* — Edward Tso
*Assistant Examiner* — Ahmed H Omar
(74) *Attorney, Agent, or Firm* — Carlson, Gaskey & Olds, P.C.

(57) ABSTRACT

An example electrical power system includes a bus current controller configured to adjust a direct current (DC) provided on a DC bus, and a plurality of energy storage modules (ESMs). Each ESM includes at least one energy storage device, and includes a DC/DC converter configured to control charging of the at least one energy storage device from the DC bus and discharging of the at least one energy storage device onto the DC bus. A shared system controller is configured to control the bus current controller and the plurality of DC/DC converters. A method of controlling an electrical power system is also disclosed.

20 Claims, 6 Drawing Sheets

(56) References Cited

U.S. PATENT DOCUMENTS

| | | | |
|---|---|---|---|
| 2008/0246443 A1* | 10/2008 | Doljack | F02N 11/0866 320/167 |
| 2010/0133025 A1* | 6/2010 | Flett | H02J 7/1423 180/65.21 |
| 2011/0114625 A1* | 5/2011 | Chung | A47J 39/006 219/385 |
| 2011/0140649 A1* | 6/2011 | Choi | H01M 14/005 320/101 |
| 2012/0013182 A1 | 1/2012 | Minegishi et al. | |
| 2012/0043938 A1* | 2/2012 | Swenson | H02J 7/34 320/128 |
| 2012/0173059 A1* | 7/2012 | Andris | B60L 50/15 903/903 |
| 2012/0212174 A1* | 8/2012 | Ishikawa | H02J 7/342 320/103 |
| 2012/0326668 A1* | 12/2012 | Ballatine | H02J 1/102 320/109 |
| 2013/0099720 A1* | 4/2013 | Chuah | H02J 7/0071 307/66 |
| 2014/0009117 A1* | 1/2014 | Ishii | H01M 10/482 320/126 |
| 2014/0156099 A1* | 6/2014 | Ayana | H02M 7/219 700/297 |
| 2016/0001662 A1* | 1/2016 | Miller | H02J 7/025 307/104 |
| 2016/0105030 A1* | 4/2016 | Neuhaus | G06F 1/263 700/298 |
| 2017/0133852 A1* | 5/2017 | Macdonald | H02J 5/00 |
| 2017/0214251 A1* | 7/2017 | Dharmadhikari | H02J 7/0013 |
| 2017/0253127 A1* | 9/2017 | Ciaccio | B60L 53/00 |
| 2017/0256957 A1 | 9/2017 | Buiel et al. | |
| 2017/0373510 A1* | 12/2017 | Morita | H02J 1/08 |
| 2018/0015831 A1* | 1/2018 | Rozman | H02M 7/49 |
| 2018/0041028 A1* | 2/2018 | Wilhide | H02M 3/04 |
| 2018/0056793 A1* | 3/2018 | Rozman | H02K 19/16 |
| 2018/0362181 A1* | 12/2018 | Iwashima | H02M 7/12 |
| 2019/0031125 A1* | 1/2019 | Rozman | B60L 53/20 |
| 2020/0189625 A1* | 6/2020 | Filippone | H02J 7/14 |
| 2020/0280183 A1* | 9/2020 | Yamashita | H02J 7/35 |
| 2021/0197679 A1* | 7/2021 | Kouvo | B60L 53/20 |

OTHER PUBLICATIONS

European Search Report for European Patent No. 19176303.6 completed Sep. 25, 2019.

* cited by examiner

ELECTRICAL POWER SYSTEM INCLUDING ENERGY STORAGE MODULES AND SHARED SYSTEM CONTROLLER

BACKGROUND

This application relates to electrical power systems, and more particularly, to an electrical power system that utilizes a shared system controller.

Vehicles such as aircraft and infantry fighting vehicles (e.g., "HUMVEEs") often include electrical power systems with an on-board generator that provides electrical power. The generated electrical power is used to power on-board electrical components such as vehicle controls (e.g., ailerons and rudders in the case of an aircraft), sensors, and/or other on-board electrical devices. These items collectively act as a baseline electrical load that requires a baseline amount of electrical power.

The vehicle may also include pulse loads that require supplemental power, causing a spike in the overall load of the electrical system. Some example pulse loads could include a radar or a directed energy weapon. On-board energy storage devices that charge from the generator can be used to provide supplemental power for pulse loads.

SUMMARY

An example electrical power system includes a bus current controller configured to adjust a direct current (DC) provided on a DC bus, and a plurality of energy storage modules (ESMs). Each ESM includes at least one energy storage device, and includes a DC/DC converter configured to control charging of the at least one energy storage device from the DC bus and discharging of the at least one energy storage device onto the DC bus. A shared system controller is configured to control the bus current controller and the plurality of DC/DC converters.

An example method of controlling an electrical power system includes providing DC from a source to a DC bus, selectively charging energy storage devices of respective ESMs from the DC bus, and selectively discharging the energy storage devices of the respective ESMs onto the DC bus. Performance of said providing, selectively charging, and selectively discharging is controlled by a shared system controller.

The embodiments, examples, and alternatives of the preceding paragraphs, the claims, or the following description and drawings, including any of their various aspects or respective individual features, may be taken independently or in any combination. Features described in connection with one embodiment are applicable to all embodiments, unless such features are incompatible.

DETAILED DESCRIPTION

Figure 1:
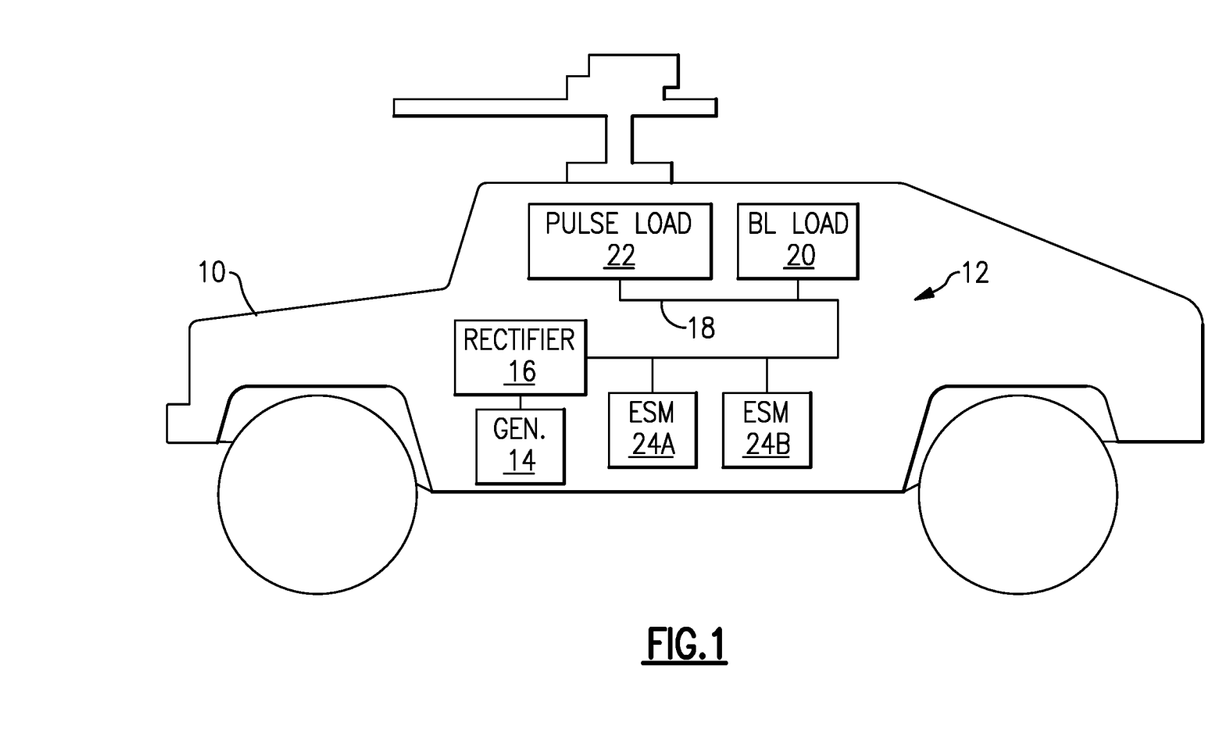
FIG. 1 is a schematic view of an example vehicle that includes an electrical power system.

FIG. 1 is a schematic view of an example vehicle 10 that includes an electrical power system 12. The electrical power system 12 includes a generator 14, rectifier 16, and DC bus 18. The generator 14 converts rotational movement (e.g., of a rotor of the vehicle 10) to electrical power. The rectifier 16 converts alternating current (AC) from the generator 14 to direct current (DC), and provides the DC to the DC bus 18. The rectifier 16 can be an active rectifier or a passive rectifier, for example. The generator 14 could be a permanent magnet machine or wound field synchronous generator, for example.

A baseline load 20 and one or more pulse loads 22 are powered by the DC bus 18. The baseline load 20 could include vehicle controls, sensors, and/or other electrical devices of the vehicle 10, for example. The pulse load 22 could include one or more of a radar device and a directed energy weapon, for example. Although an infantry fighting vehicle 10 is depicted in FIG. 1, it is understood that the electrical power system 12 is not limited to ground vehicles, and could be used in other environments and vehicles, such as aircraft.

The electrical power system 12 includes a plurality of energy storage modules (ESMs) 24A-B that are configured to charge from the DC bus 18 in a charging mode, and to act as supplemental power stages by providing supplemental power to the DC bus 18 in a discharging mode when the one or more pulse loads 22 are utilized. Each pulse load 22 needs a relatively large amount of power over a relatively short time duration, and the ESMs 24 are able to meet that power demand. Although only two ESMs 24A-B are shown in FIG. 1, it is understood that additional ESMs 24 could be used if desired.

In this disclosure, like reference numerals designate like elements where appropriate and reference numerals with the addition of one-hundred or multiples thereof designate modified elements that are understood to incorporate the same features and benefits of the corresponding elements.

Figure 2:
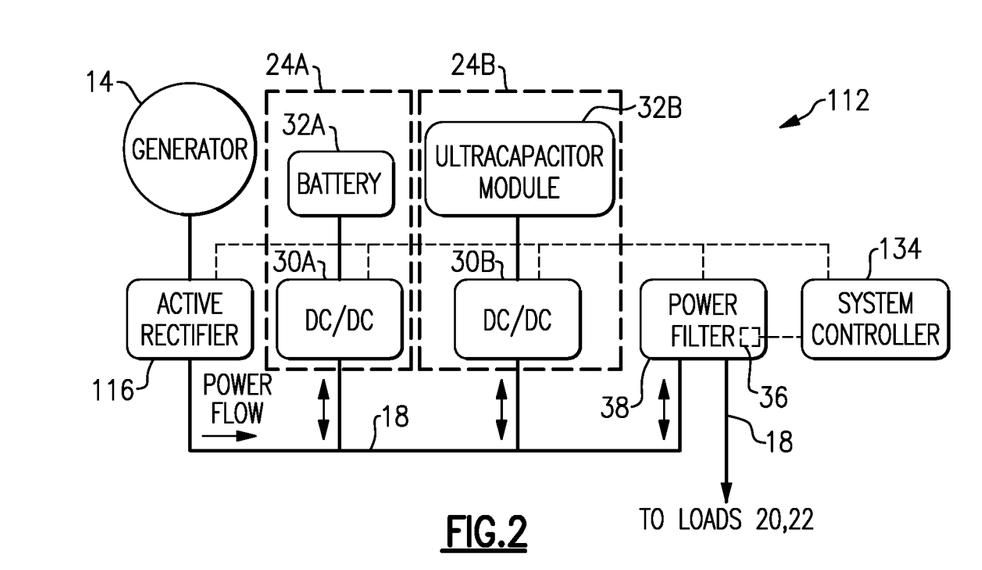
FIG. 2 is a schematic view of an example of the electrical power system of FIG. 1 which uses an active rectifier.

FIG. 2 is a schematic view of an example electrical power system 112 in which the rectifier 16 is an active rectifier 116. As shown in FIG. 2, each ESM 24 includes a respective DC/DC converter 30 and at least one energy storage device 32. The energy storage devices 32 can include a variety of energy storage devices, such as batteries, fuel cells, and ultracapacitors, for example. Ultracapacitors are high-capacity capacitors that can typically store 10-100 times more energy per unit volume or mass than electrolytic capacitors.

In the example of FIG. 2, the energy storage device 32A of ESM 24A includes one or more batteries, and the energy storage device 32B of ESM 24B includes one or more ultracapacitors. In other examples, the energy storage devices 32A-B include the same type of energy storage device.

Each ESM 24 includes a respective DC/DC converter 30 configured to control charging of its energy storage device 32 from the DC bus 18 and to control discharge of its energy storage device 32 onto the DC bus 18.

In one example, the voltages of the energy storage devices 32 have a lower magnitude than that of the DC bus 18. In such an example, the DC/DC converters 30 operate in a buck mode when charging the energy storage devices 32 and operate in a boost mode when discharging the energy storage devices 32. In the buck mode, the DC/DC converters 30A-B convert the larger magnitude DC voltage from the DC bus 18 to a lower magnitude DC voltage for charging the energy storage devices 32. This is also known as "sinking" current from the DC bus 18.

In the boost mode, the DC/DC converters 30A-B convert the lower magnitude voltages of the energy storage devices 32 to the higher magnitude voltages of the DC bus 18 for discharging the energy storage devices 32 onto the DC bus. This is also known as "sourcing current" to the DC bus 18.

A system controller 134 acts as a voltage regulator by controlling the active rectifier 116 to achieve desired DC voltage and DC current levels on the DC bus 18 based on measurements from a voltage sensor 36. The current demand on the DC bus 18 can change based on operation of the loads 20, 22, and the current output by the generator 14 can also change (e.g., based on an engine speed of the vehicle 10). The system controller 134 accommodates these operating conditions by adjusting the output of the active rectifier 116 to achieve a desired DC current and DC voltage on the DC bus 18 for powering the base line load 20. The system controller 134 also selectively discharging the ESMs 24 to power the one or more pulse loads 22. In this regard, the generator 14 and ESM 24A-B function as current sources to support the voltage regulation provided by the system controller 134.

The system controller 134 controls the DC/DC converters 30A-B to control charging and discharging of the ESMs 24. The system controller 134 is configured to maintain a desired "state of charge" (SoC) of the each energy storage devices 32. SoC refers to a charge level of the energy storage devices 32, and is akin to a fuel gauge for the energy storage devices 32. A SoC is generally measured as a percentage, where a SoC of 0 means that an energy storage device 32 has no charge and is "empty" and a SoC of 100 means that an energy storage device 32 is fully charged and is "full." In one example, the system controller 134 seeks to maintain a threshold SoC level, such as 70%, in the energy storage devices 32.

A "slew rate" refers to how fast a power source can respond to a load demand. A slew rate may be measured in kilowatts/millisecond, for example. The slew rate of the ESMs 24 is faster than the slew rate of the rectifier 116. This makes the ESMs 24 suitable for powering pulse loads 22 that need a relatively large amount of power over a relatively short time duration. In one example, the slew rate of the active rectifier 116 is on the order of 5 kw/ms and the slew rate of the ESMs is on the order of 300 kw/ms. Ultracapacitors typically have a higher slew rate than batteries.

The system controller 134 is configured to control the active rectifier 116 and plurality of DC/DC converters 30 based on DC bus voltage measurements from the voltage sensor 36. The system controller 134 uses the voltage sensor 36 as part of a feedback loop so that the system controller 134 can monitor voltage levels on the DC bus and adjust the active rectifier 116 output accordingly. When a pulse load 22 is activated, there is a spike in a power demand on the DC bus 18. The system controller 134 detects this spike, and in one example determines that the active rectifier will only be able to source a portion (e.g., 40%) of the demand. Based on the determination, the system controller 134 commands the DC/DC converter 30 of one or both of the ESMs 24 to discharge onto the DC bus to meet the remaining load demand of the pulse load 22.

The system controller 134 also controls when the DC/DC converters 30 charge their respective energy storage devices 32 from the DC bus 18. In one example, the system controller 134 commands one or both of the DC/DC converters 30 to charge their respective energy storage devices 32 when an actual current on the DC bus 18 exceeds a target current level and/or when the SoC of the ESMs is below a threshold level. In one example, the system controller 134 includes a field-programmable gate array (FPGA), a microprocessor (e.g., a digital signal processor "DSP"), or a combination thereof.

The same system controller 134 is used to control the active rectifier 116 and the DC/DC converters 30A-B, and in this regard is a shared controller. In the prior art, separate controllers have been used for an active rectifier and ESM DC/DC converters, with each controller using its own control loop, and with the active rectifier being tuned to match the considerably slower response of a vehicle engine while an ESM serviced loads requiring a quicker response time (also known as "high bandwidth" loads). This led to redundancies, complex control algorithms, and use of a feature called "voltage trimming" whereby if the active rectifier controller wanted the ESMs 24 to discharge, it would intentionally "trim" the voltage on the DC bus to a lower value to cause the ESMs 24 to discharge. Such voltage trimming is not necessary with the shared system controller 134, because the system controller 134 is shared and can directly cause the DC/DC converters 30 to discharge without the need for voltage trimming.

The improved coordination provided by the shared system controller 134 can also prevent other issues previously encountered due to use of separate controllers. For example, in the prior art, the controllers sometimes competed with each other such that the active rectifier controller would unnecessarily try to boost its output to meet a load demand on the DC bus that could have been met by an ESM. By using the shared system controller 134, such conflicts can be avoided.

The shared system controller 134 also helps avoid potential instability issues. If separate controllers are used, and an erroneous sensor reading is received indicating a pulse load demand, an ESM could potentially discharge unnecessarily and cause a surge on the DC bus. Such an event is less likely when the shared system controller 134 is used.

The voltage sensor 36 is part of a power filter 38 that provides for electromagnetic interference (EMI) filtering of the DC current on the DC bus 18. In the example of FIG. 2, the power filter 38 is connected to the DC bus 18 at a location between that of the plurality of ESMs 24 and the loads 20, 22. The power filter 38 is also shared by the active rectifier 116 and ESMs 24. Unlike the prior art where separate power filters were used, the power filter 38 is shared, which removes the need for multiple power filters 38.

Figure 3:
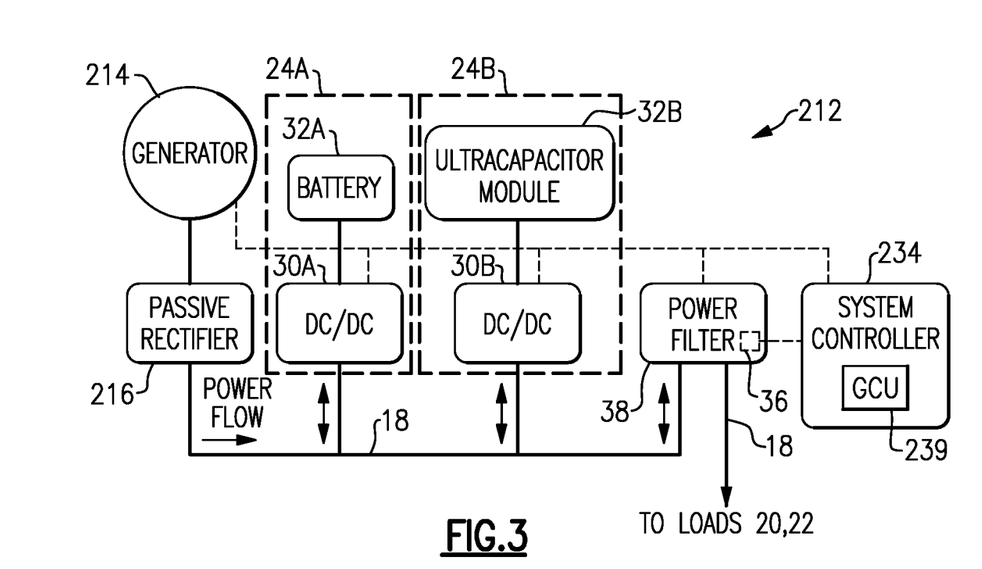
FIG. 3 is a schematic view of an example of the electrical power system of FIG. 1 which uses a passive rectifier.

FIG. 3 is a schematic view of an example electrical power system 212 which uses a passive rectifier 216 instead of an active rectifier 116, and in which the generator 214 is a wound field synchronous generator. The passive rectifier 216 is not controlled by system controller 234. However, the system controller 234 includes a generator control unit (GCU) 239 that can adjust an output of the generator 14, and thereby control the output of the generator 14 that is provided to the passive rectifier 216. Thus, even though operation of the passive rectifier 216 itself is not controlled, the system controller 234 can still influence the output of the passive rectifier 216 by controlling the GCU 239. The remaining components of the electrical power system 112 operate as described above in connection with FIG. 2. Here too, the generator 214 and ESM 24A-B function as current sources to support the voltage regulation provided by the system controller 234.

In the embodiments of FIGS. 2-3, the active rectifier 116 and GCU 239 operate as DC bus 18 current controllers because they can control a DC current that is provided on the DC bus 18.

Figure 4:
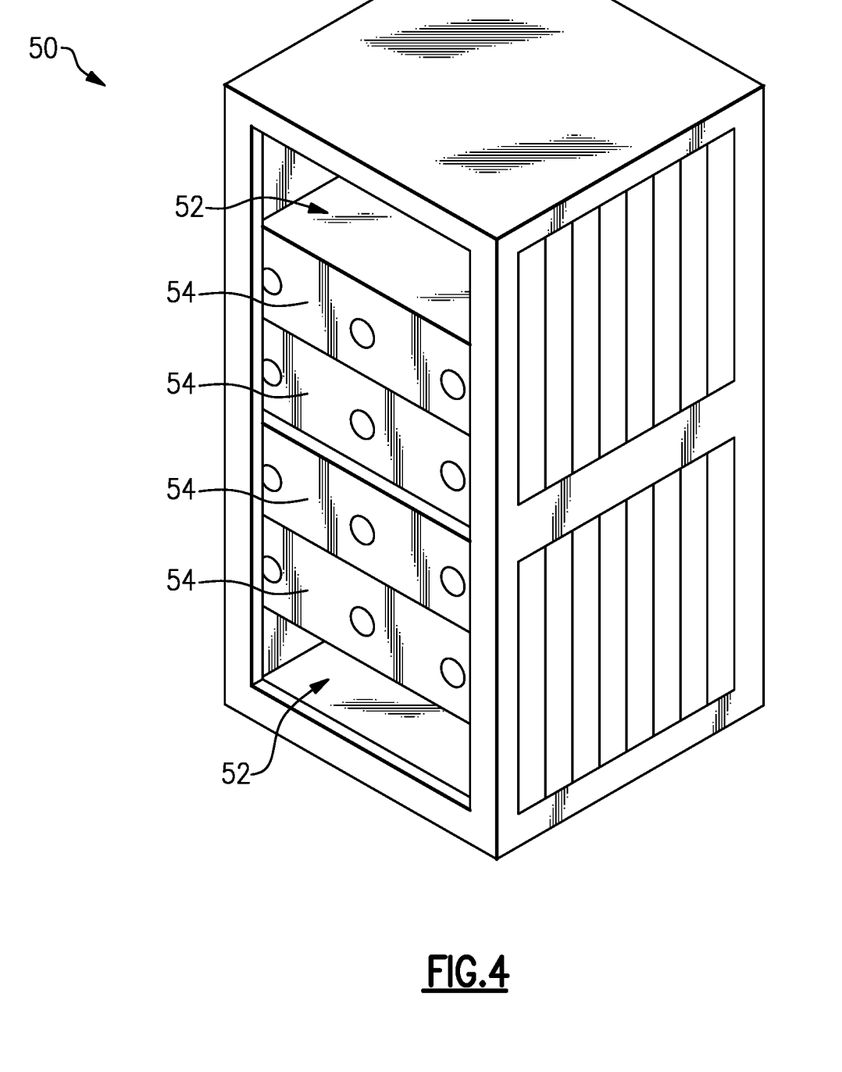
FIG. 4 schematically illustrates an example mounting rack for storing components of an electrical power system.

FIG. 4 schematically illustrates an example mounting rack 50 for storing components of the electrical power system 112, 212. The mounting rack 50 defines a plurality of stacked receiving areas 52. In one example, one or more of the DC/DC converters 30, system controller 134/234, power filter 38, rectifier 116/216, and GCU 239 are provided on a plurality of circuit boards 54, each of which are mounted in the stacked receiving areas 52.

Although six slots are shown in FIG. 4, with four of those slots including circuit boards 54, it is understood that this is a non-limiting example and that other quantities of slots and boards could be used.

Figure 5:
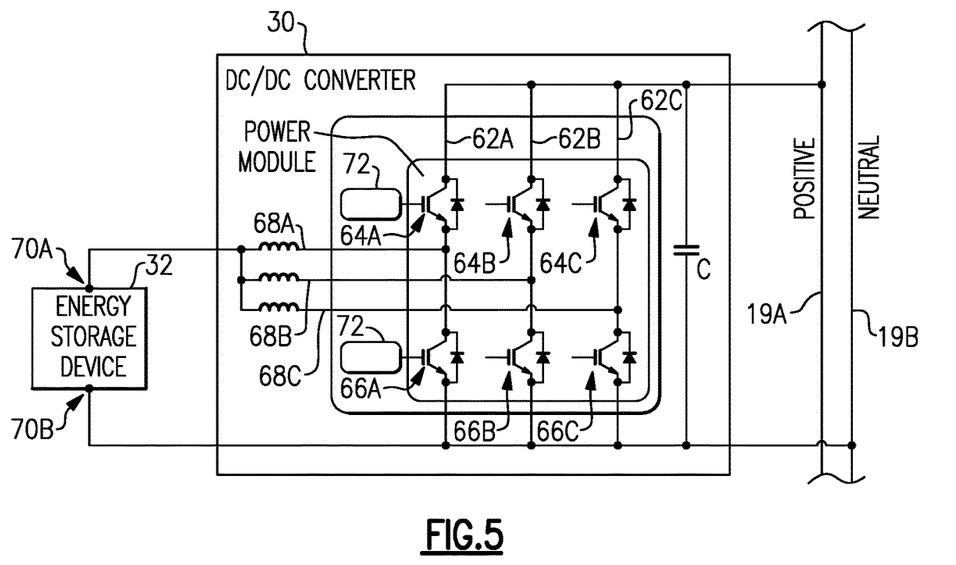
FIG. 5 is a schematic view of an example implementation of a DC/DC converter.

FIG. 5 is a schematic view of an example implementation of the DC/DC converter 30, which utilizes a plurality of switching legs 62A-C. Each switching leg 62 connects to a respective line 68A-C. Each switching leg 62 includes a respective first switch 64 and a respective second switch 66. Each first switch 64 connects its line 68 to a positive rail 19A of the DC bus 18, and each second switch 66 connects its line 68 to a ground rail 19B of the DC bus 18. The lines 68 all connect to terminal 70A of the energy storage device 32. A gate drive 72 operates the switches 64, 66 to either charge the energy storage device 32 from the DC bus 18 (during which lines 68 act as inputs), or discharge the energy storage device 32 onto the DC bus 18 (during which lines 68 act as outputs). A capacitor C is connected in parallel to the switching legs 62A-C.

Figure 6:
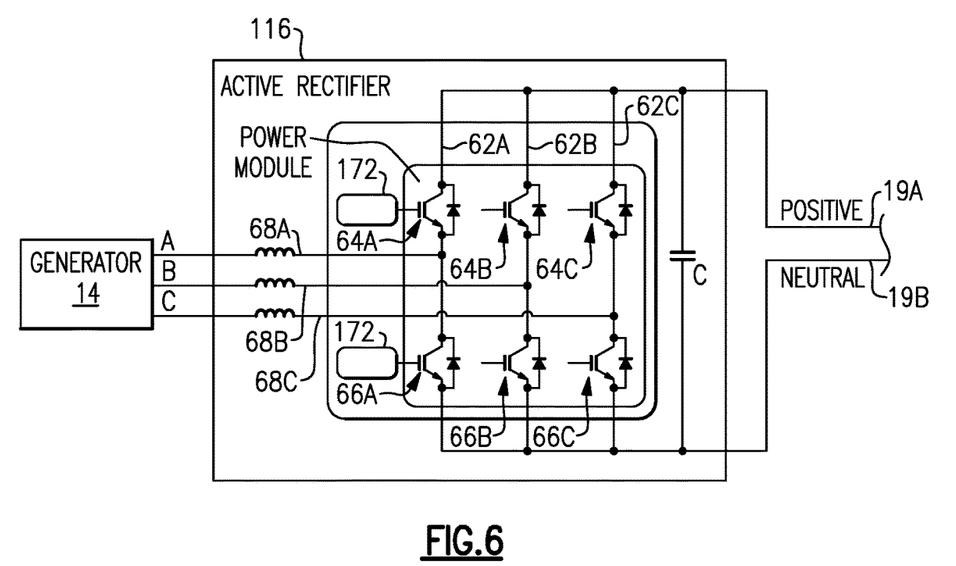
FIG. 6 is a schematic view of an example implementation of an active rectifier.

In the case of a vehicle such as an aircraft, the ground rail 19B may be a neutral rail that acts as a ground. In such an example, the ground rail 19B could connect to a chassis of the vehicle 10 or a neutral terminal of the generator 14, for example FIG. 6 is a schematic view of an example implementation of the active rectifier 116 which utilizes the same switching topology which includes the plurality of switching legs 62A-C, each including a respective pair of switches 64, 66. In the example of FIG. 6, the inputs on lines 68A-C correspond to phases of current (shown as A, B, C) from the generator 14. In one example, because the DC/DC converter 30 and active rectifier 116 use the same circuit topology, a same circuit board 54 can be used for each of the DC/DC converter 30 and active rectifier 116 in the mounting rack 50 of FIG. 4.

Figure 7:
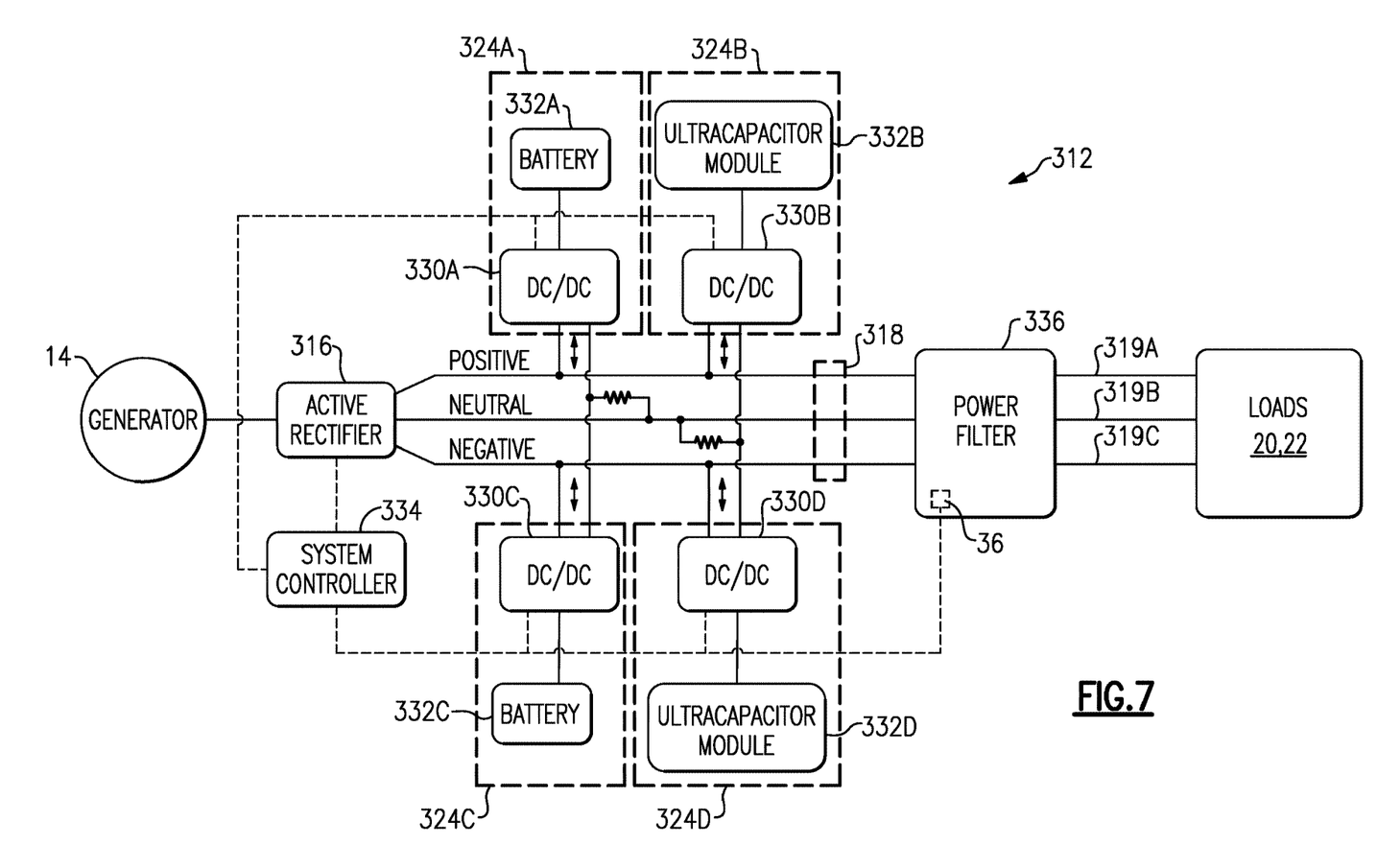
FIG. 7 is a schematic view of an example power control system that utilizes a split DC bus.

FIG. 7 is a schematic view of an example power control system 312 that utilizes a split DC bus 318 that includes a positive rail 319A that provides a positive voltage, a negative rail 319C that provides a negative voltage, and a ground rail 319B. ESMs 324A and 324C are connected in a "series stacked" configuration in which ESM 324A charges from and discharges onto the positive rail 319A, and ESM 324C charges from and discharges onto the negative rail 319C. Similarly, ESMs 324B and 324D are also connected in a series stacked configuration in which ESM 324B charges from and discharges onto the positive rail 319A, and ESM 324D charges from and discharges onto the negative rail 319C. A same shared system controller 334 controls each of the DC/DC converters 330A-D of each of the ESMs 324A-D. Use of the split DC bus 318 is a technique to achieve a desired total bus voltage (e.g., 600 volts) by using smaller positive and negative rail voltages (e.g., +300 volts on positive rail 319A and −300 volts on negative rail 319C).

Figure 8:
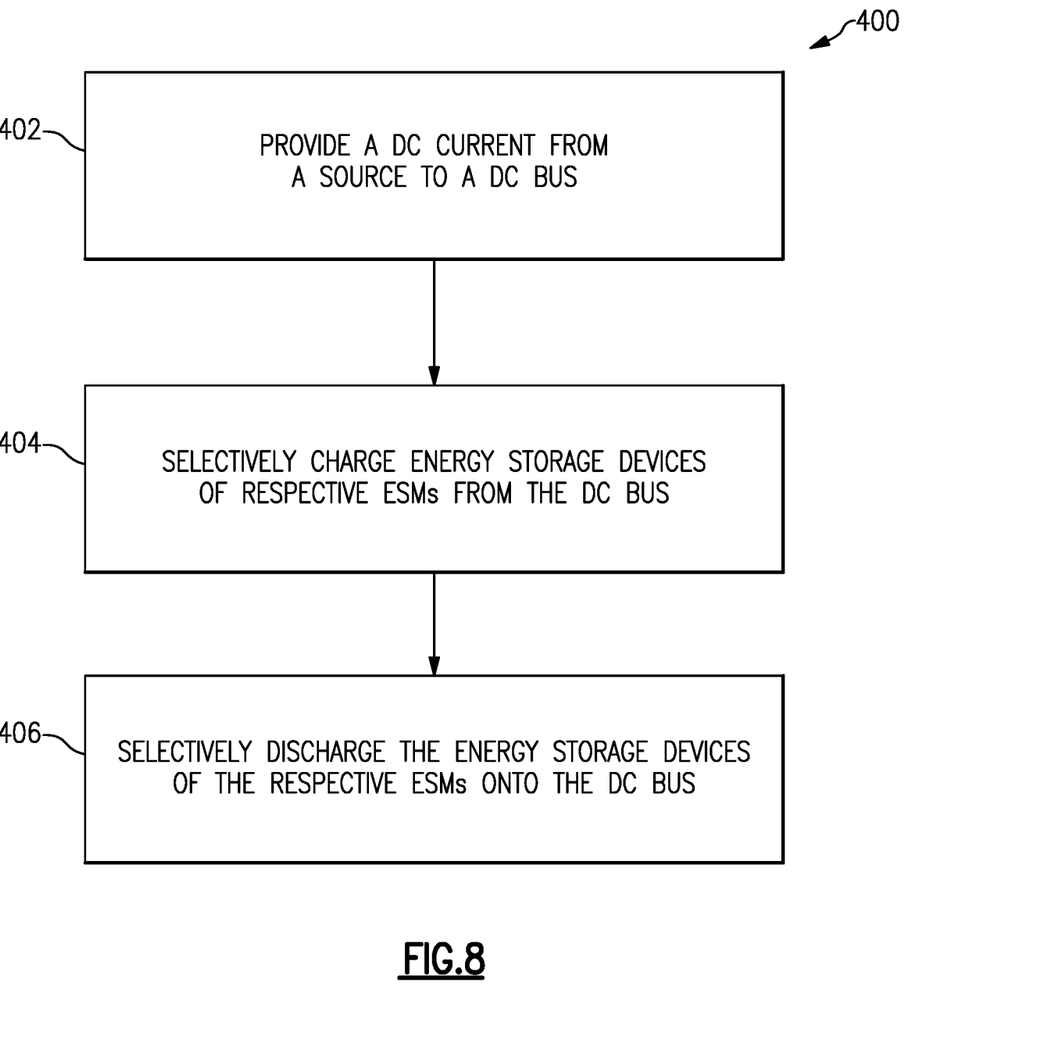
FIG. 8 is a flowchart illustrative of an example method of controlling an electrical power system.

FIG. 8 is a flowchart 400 illustrative of an example method of controlling an electrical power system 12. DC current is provided from a source to a DC bus 18 (step 402). Step 402 could include using an active rectifier 116 and/or using a generator control unit 239 to control the DC current, for example. Energy storage devices 32A-B of respective ESMs 24 are selectively charged from the DC bus (step 404), and are selectively discharged onto the DC bus (step 406). Shared system controller 34 controls performance of steps 402-406.

Although example embodiments have been disclosed, a worker of ordinary skill in this art would recognize that certain modifications would come within the scope of this disclosure. For that reason, the following claims should be studied to determine the scope and content of this disclosure.

What is claimed is:

1. An electrical power system for a vehicle, comprising:
   a generator configured to generate alternating current (AC);
   a rectifier configured to rectify the AC from the generator to direct current (DC) on a DC bus to power a plurality of DC loads of the vehicle;
   a bus current controller configured to adjust the DC provided on the DC bus by the generator, the bus current controller comprising either the rectifier or a generator control unit that is separate from the rectifier and controls an output of the generator;
   a plurality of energy storage modules (ESMs), each comprising at least one energy storage device, and a DC/DC converter configured to control charging of the at least one energy storage device from the DC bus and discharging of the at least one energy storage device onto the DC bus, wherein each DC/DC converter has an independent connection to the DC bus; and
   a shared system controller configured to control the bus current controller and the plurality of DC/DC converters;
   wherein the at least one energy storage device of a first ESM of the plurality of ESMs comprises a first type of energy storage device, and the at least one energy storage device of second ESM of the plurality of ESMs comprises a second type of energy storage device that is different from the first type of energy storage device;
   wherein the DC bus comprises a positive rail configured to provide a positive DC voltage, a negative rail configured to provide a negative DC voltage, and a ground rail; and
   wherein the plurality of ESMs includes a pair of ESMs that includes the first ESM and a third ESM of the plurality of ESMs connected in a series stacked configuration such that the DC/DC converter of the first ESM and the DC/DC converter of the third ESM are connected to each other through a path separate from the DC bus, the first ESM charges from and discharges onto the positive rail, and the third ESM charges from and discharges onto the negative rail.

2. The electrical power system of claim 1, wherein the at least one energy storage device of one of the ESMs comprises one or more batteries.

3. The electrical power system of claim 1, wherein the at least one energy storage device of one of the ESMs comprises one or more ultracapacitors.

4. The electrical power system of claim 1, comprising:
   a voltage sensor configured to measure a voltage on the DC bus;

wherein the shared system controller is configured to control the bus current controller and the plurality of DC/DC converters based on DC bus voltage measurements from the voltage sensor.

5. The electrical power system of claim 1, wherein the bus current controller comprises the rectifier, which is an active rectifier.

6. The electrical power system of claim 5, wherein the active rectifier and DC/DC converters each utilize a same switching topology.

7. The electrical power system of claim 6, wherein:
the active rectifier and DC/DC converters each comprise a plurality of switching legs, each switching leg comprising a pair of switches and controlling connection of a respective input to the DC bus;
the respective inputs of the DC/DC converters each connect to the DC bus; and
the respective inputs of the active rectifier comprise respective phases of current from the generator.

8. The electrical power system of claim 7, comprising:
a mounting rack defining a plurality of stacked receiving areas;
wherein the DC/DC converters, shared system controller, and bus current controller are provided on a plurality of circuit boards, each circuit board mounted in one of the stacked receiving areas.

9. The electrical power system of claim 1, wherein:
the rectifier is a passive rectifier; and
the bus current controller comprises the generator control unit.

10. The electrical power system of claim 1, comprising:
a power filter connected to the DC bus between the plurality of ESMs and the plurality of DC loads of the vehicle, the power filter configured to provide electromagnetic interference (EMI) filtering for the DC current on the DC bus.

11. The electrical power system of claim 1, wherein the shared system controller is configured to discharge at least one of the ESMs onto the DC bus based on activation of a pulse load connected to the DC bus.

12. The electrical power system of claim 1, wherein the shared system controller is configured to charge at least one of the ESMs from the DC bus based on a current on the DC bus exceeding a target current level determined by the shared system controller.

13. The electrical power system of claim 1, wherein the shared system controller comprises a field-programmable gate array (FPGA), a digital signal processor (DSP), or a combination thereof.

14. The electrical power system of claim 1, wherein:
the first ESM that comprises the first type of energy storage device type is connected to the positive rail and the ground rail, but not the negative rail; and
the second ESM that comprises the second type of energy storage device is connected to the negative rail and the ground rail, but not the positive rail.

15. A method of controlling an electrical power system for a vehicle, comprising:
rectifying alternating current (AC) from an electrical generator to direct current (DC) with a rectifier;
providing the DC from the rectifier to a DC bus that includes a positive rail configured to provide a positive DC voltage, a negative rail configured to provide a negative DC voltage, and a ground rail;
selectively charging energy storage devices of a plurality of energy storage modules (ESMs) from the DC bus;
selectively discharging the energy storage devices of the plurality of ESMs onto the DC bus to power one or more DC loads of a vehicle, wherein each ESM has an independent connection to the DC bus through a respective DC/DC converter, and wherein the energy storage device of a first ESM of the plurality of ESMs comprises a first type of energy storage device, and the energy storage device of second ESM of the plurality of ESMs comprises a second type of energy storage device that is different from the first type of energy storage device; and
utilizing a shared system controller to perform said selectively charging, selectively discharging, and at least one of:
performing said rectifying utilizing an active rectifier as the rectifier; and
controlling an output of the generator by utilizing a generator control unit that is separate from the rectifier;
wherein the plurality of ESMs includes a pair of ESMs that includes the first ESM and a third ESM of the plurality of ESMs connected in a series stacked configuration such that the DC/DC converter of the first ESM and the DC/DC converter of the third ESM are connected to each other through a path separate from the DC bus, the first ESM charges from and discharges onto the positive rail, and the third ESM charges from and discharges onto the negative rail.

16. The method of claim 15, wherein the shared system controller performs said rectifying utilizing the active rectifier as the rectifier.

17. The method of claim 15, wherein said selectively discharging comprises:
detecting activation of a pulse load connected to the DC bus; and
discharging at least one of the ESMs onto the DC bus based on the detected activation.

18. The method of claim 15, comprising:
determining that a current on the DC bus exceeds a target current level;
wherein said selectively charging energy storage devices of the plurality of ESMs from the DC bus is performed based on the determining.

19. The method of claim 15, wherein:
said selectively charging energy storage devices of the plurality of ESMs from the DC bus comprises operating respective DC/DC converters of the ESMs in a buck mode; and
said selectively discharging the energy storage devices of the plurality of ESMs onto the DC bus comprises operating respective DC/DC converters of the ESMs in a boost mode.

20. the method of claim 15, wherein:
the first ESM that comprises the first type of energy storage device is connected to the positive rail and the ground rail, but not the negative rail; and
the second ESM that comprises the second type of energy storage device is connected to the negative rail and the ground rail, but not the positive rail.

* * * * *